(12) United States Patent
Lin et al.

(10) Patent No.: US 10,515,803 B1
(45) Date of Patent: Dec. 24, 2019

(54) MULTIPLE LAYER SCHEME PATTERNING PROCESS

(71) Applicant: Taiwan Semiconductor Manufacturing Company, Ltd., Hsinchu (TW)

(72) Inventors: Jiann-Horng Lin, Hsinchu (TW); Yi-Chang Lee, Taoyuan (TW); Che-Kang Chu, New Taipei (TW); Chih-Hao Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 21 days.

(21) Appl. No.: 16/034,029

(22) Filed: Jul. 12, 2018

(51) Int. Cl.
 *H01L 21/033* (2006.01)
 *H01L 21/311* (2006.01)
(52) U.S. Cl.
 CPC ...... *H01L 21/0337* (2013.01); *H01L 21/0332* (2013.01); *H01L 21/0338* (2013.01); *H01L 21/31144* (2013.01)
(58) Field of Classification Search
 CPC ............ H01L 21/0337; H01L 21/0332; H01L 21/0338

USPC .......................................... 257/703; 438/703
See application file for complete search history.

(56) References Cited

U.S. PATENT DOCUMENTS

| | | | | |
|---|---|---|---|---|
| 2002/0001943 | A1* | 1/2002 | Akram | H01L 21/76844 438/653 |
| 2002/0155661 | A1* | 10/2002 | Massingill | H01L 21/486 438/244 |
| 2012/0049286 | A1* | 3/2012 | Beyer | H01L 21/0337 257/368 |

* cited by examiner

*Primary Examiner* — Jami Valentine Miller
(74) *Attorney, Agent, or Firm* — Slater Matsil, LLP

(57) ABSTRACT

An embodiment is a method of fabricating a semiconductor structure. The method includes utilize uses of a multi-layer structure disposed on a pattern defining layer. In some embodiments, a method of fabricating a semiconductor structure includes forming a first multi-layer structure on a pattern defining layer disposed on a film stack on a substrate, patterning the first multi-layer structure to form an aperture in the first multi-layer structure, forming a first cut opening in the pattern defining layer through the aperture defined by the first multi-layer structure, and forming a second multi-layer structure on the pattern defining layer, a portion of the second multi-layer structure being disposed in the first cut opening.

20 Claims, 18 Drawing Sheets

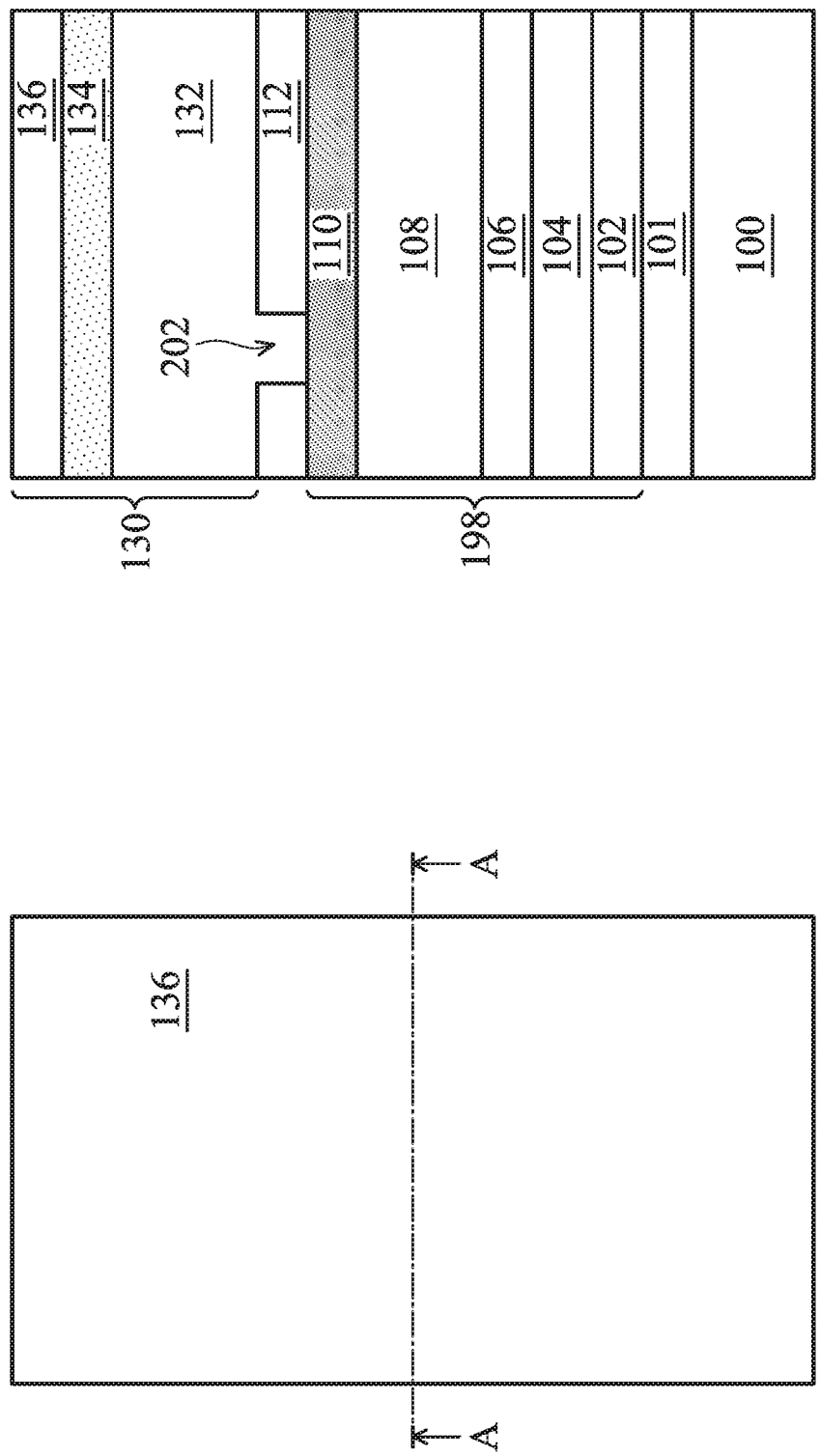

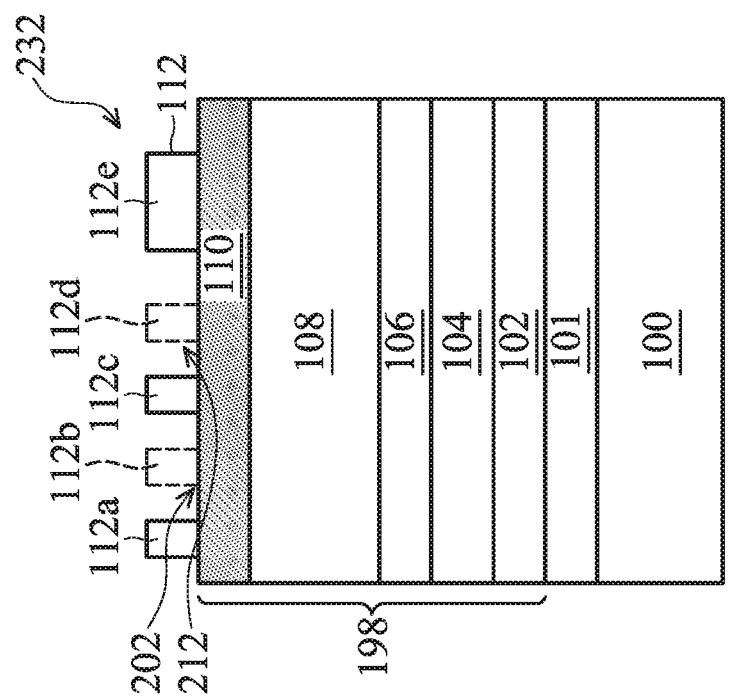
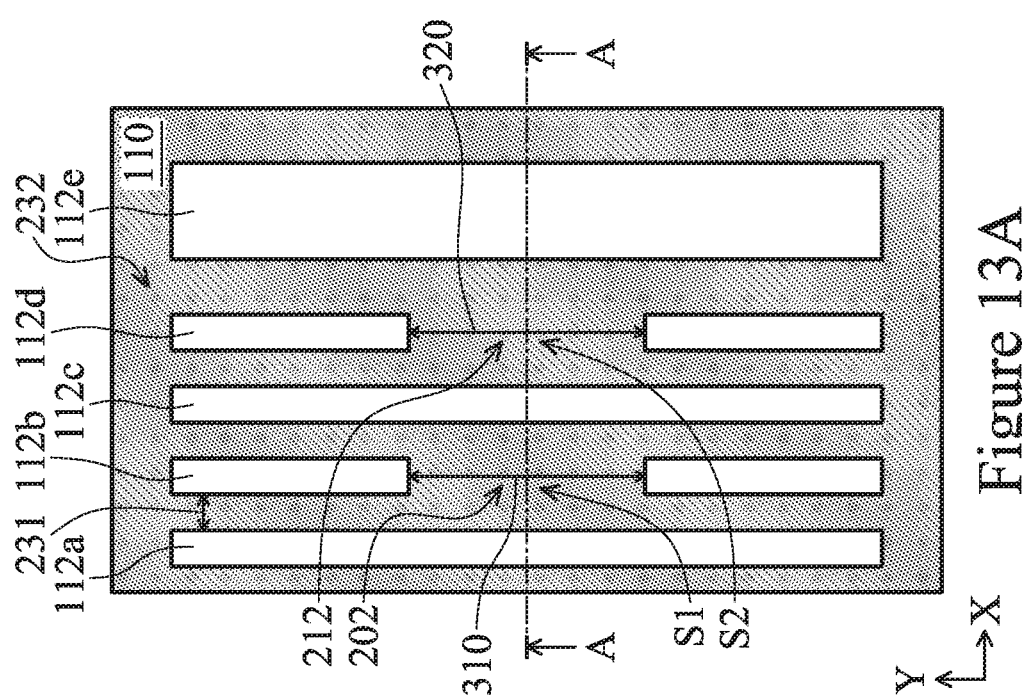
Figure 13A
Figure 13B

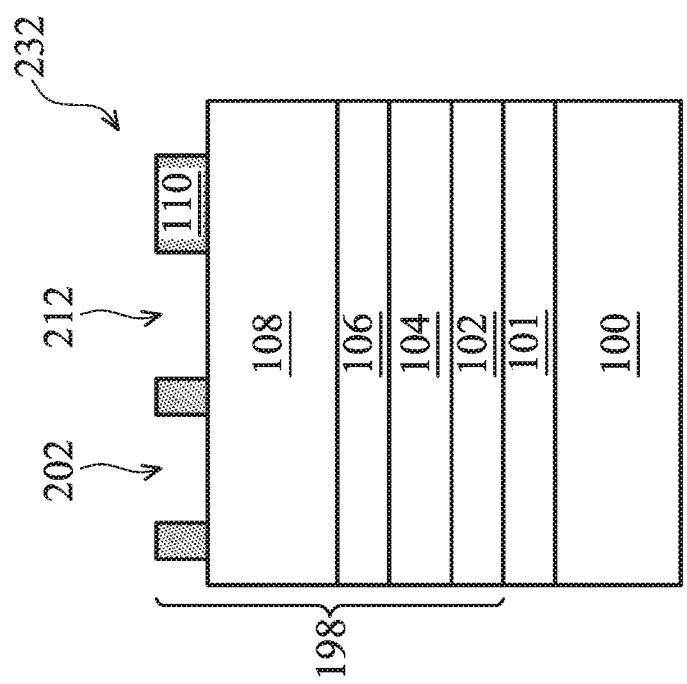
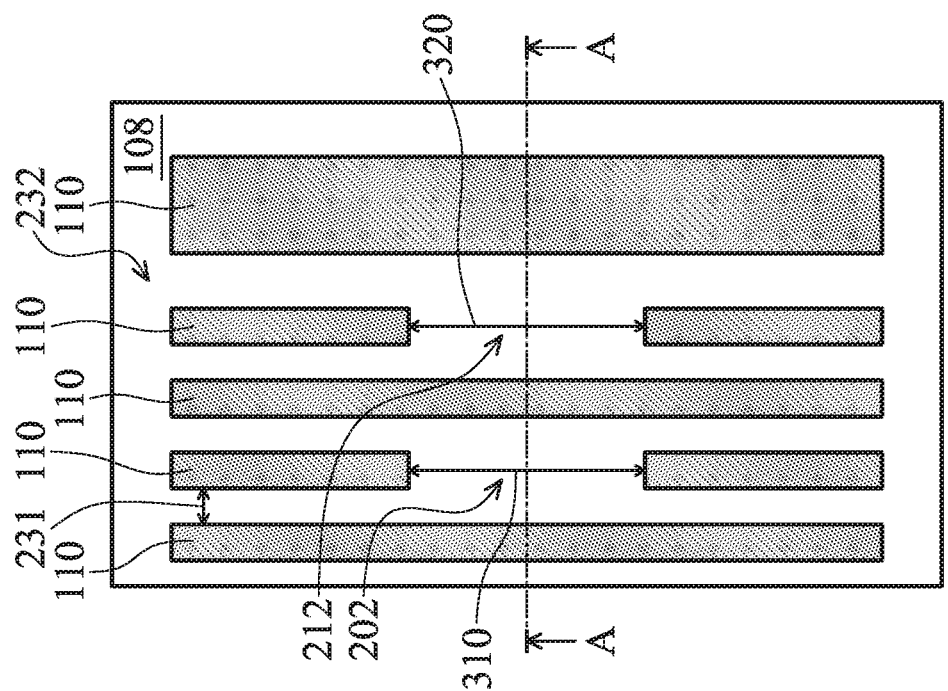
Figure 15B
Figure 15A

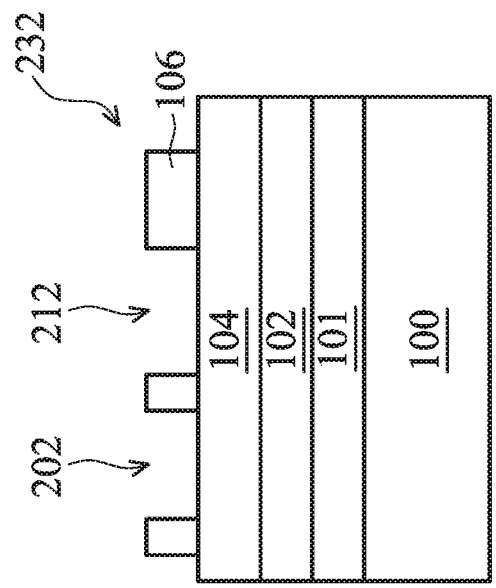
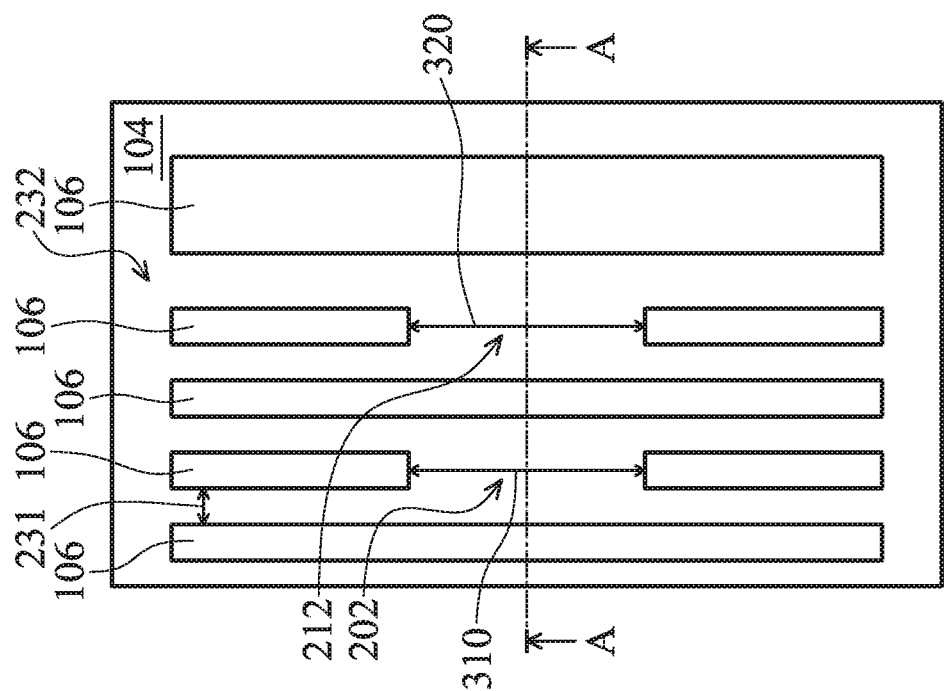
Figure 17A
Figure 17B

MULTIPLE LAYER SCHEME PATTERNING PROCESS

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreasing geometry sizes may lead to various manufacturing difficulties. For example, a multi-layer patterning scheme is commonly used to pattern layers in semiconductor processes. However, as the device sizes become smaller and smaller, the use of multi-layer patterning scheme may cause over etching or under etching of multi-layer patterning scheme, resulting in feature transfer failure, which may degrade semiconductor device performance or even lead to device failures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B, 3A-3B, 4A-4B, 5A-5B, 6A-6B, 7A-7B, 8A-8B, 9A-9B, 10A-10B, 11A-11B, 12A-12B, 13A-13B, 14A-14B, 15A-15B, 16A-16B and 17A-17B are a top view and a cross-sectional view respectively of a portion of a substrate having a tri-layer structure disposed over a film stack, in accordance with some embodiments.

DETAILED DESCRIPTION

Figure 1A:
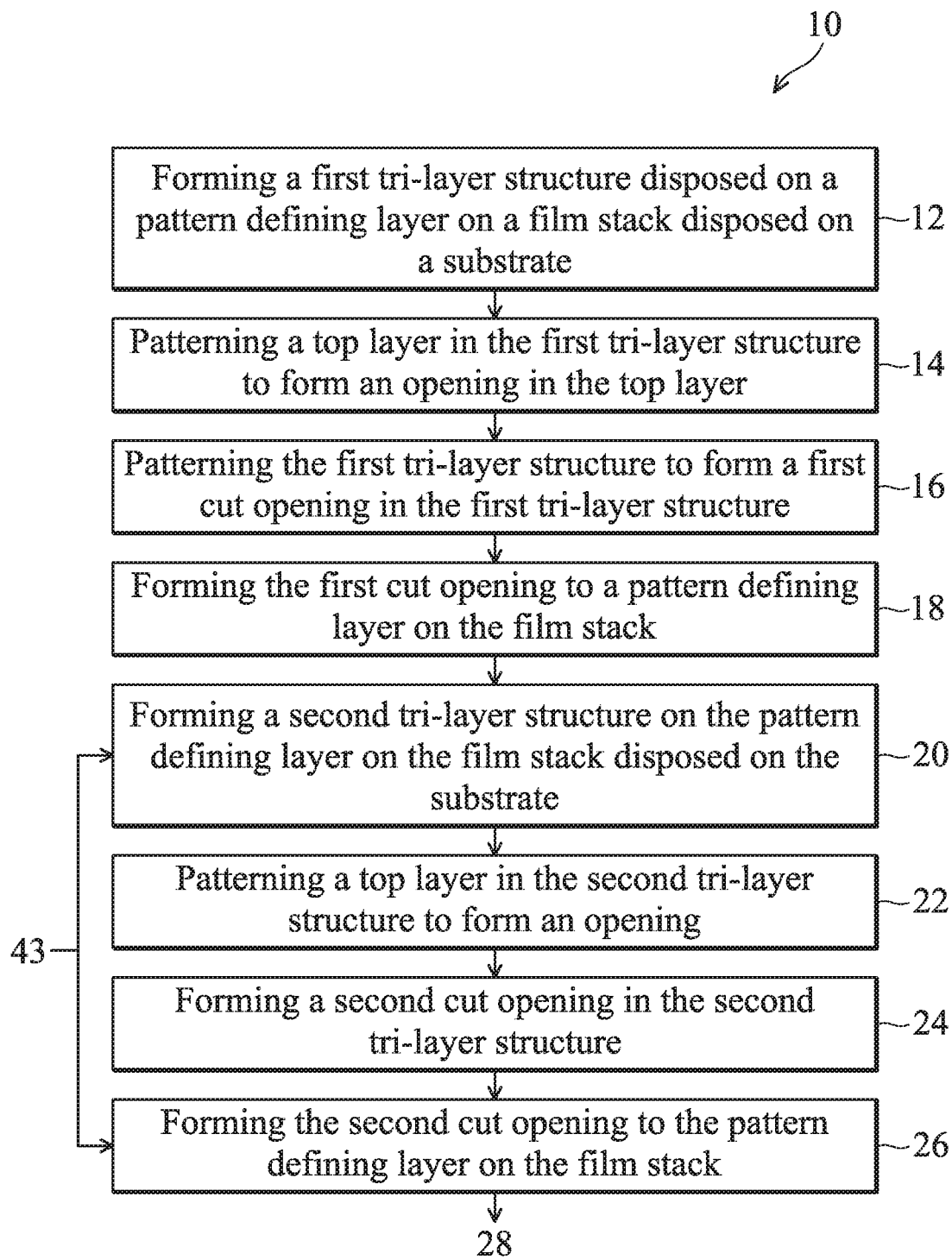
FIG. 1A-1B depicts an exemplary flow diagram of a process to form a multi-layer patterning scheme in a multi-patterning and multi-etching process to transfer features in a material layer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments as described herein are directed to a multiple layer scheme patterning method for forming features and structures having a small pitch in a material layer disposed under a multiple layer scheme. A multiple layer scheme includes a multi-layer structure, such as a tri-layer structure, disposed on a pattern defining layer on a film stack. Multiple tri-layer structures are used to transfer features and structures into the pattern defining layer disposed under the tri-layer structure. Each tri-layer structure includes a top layer, a middle layer, and a bottom layer. The film stack disposed under the tri-layer structure and the pattern defining layer comprises an etch stop layer and additional layers disposed under the etch stop layer. The pattern defining layer allows the features and structures to be transferred therein with desired profiles and dimensions. The etch stop layer disposed under the pattern defining layer assists promoting etching selectivity to the underlying additional layers in the film stack while transferring features and structures into the pattern defining layer. After the desired features are formed in the pattern defining layer, additional patterning processes are then performed to transfer the features through the additional layer in the film stack, using the pattern defining layer and the etching stop layer as the etching mask, until a material layer disposed under the film stack is patterned.

Figure 1B:
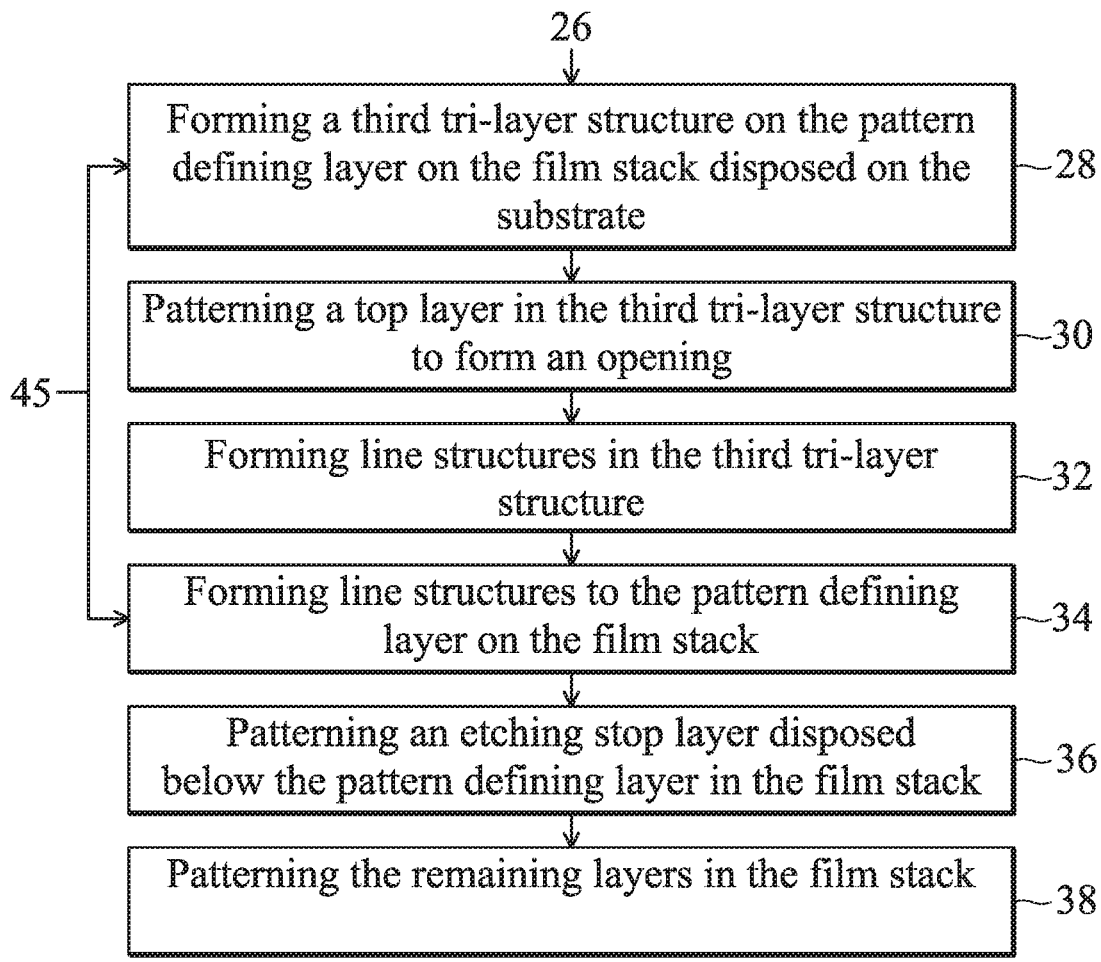

FIGS. 1A-1B depict an exemplary flow diagram of a process 10 to pattern a multiple layer scheme in a multi-etching process with respect to FIG. 2A through FIG. 17B. FIG. 2A through FIG. 17B are various schematic views of a portion of a substrate corresponding to various stages of the process 10, in accordance with some embodiments. The process 10 may be utilized to form any suitable structures, including the structures depicted in FIG. 2A through FIG. 17B or in other applicable semiconductor structures.

Figure 2B:
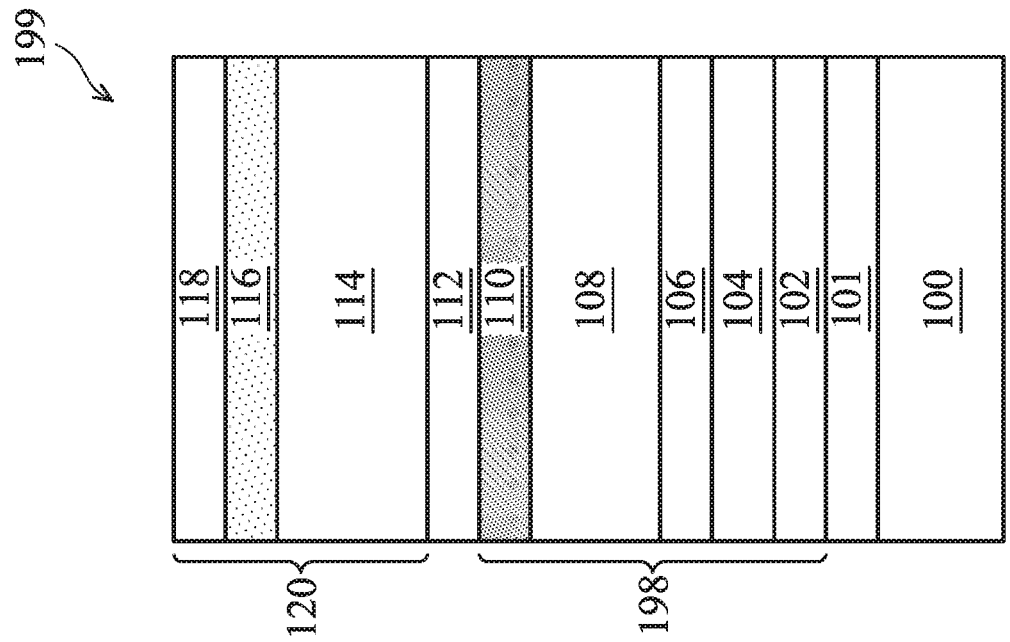
Figure 2A:
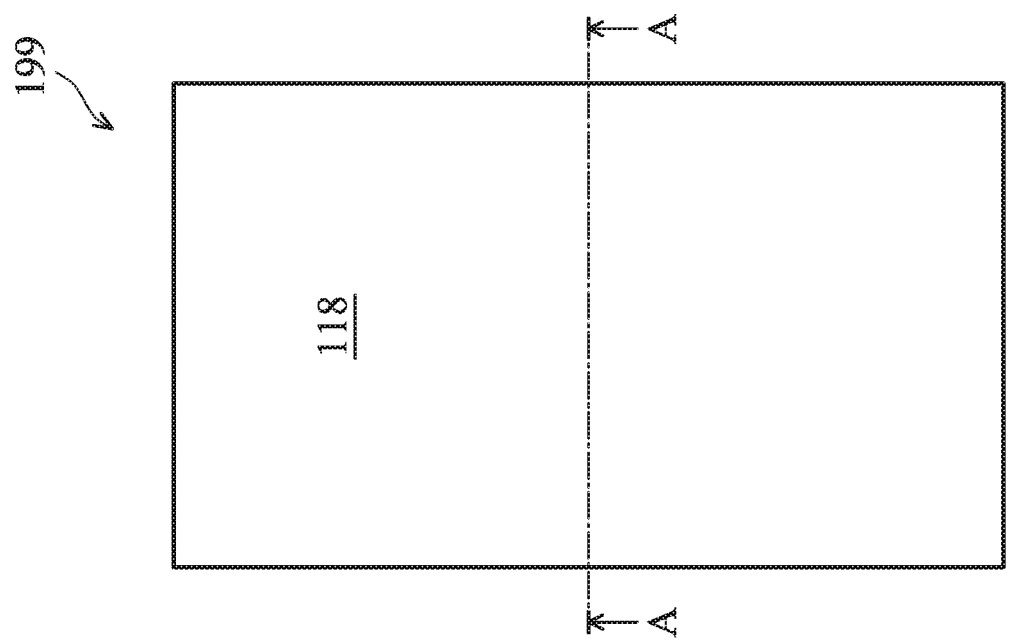

FIG. 2A illustrates a top view of a substrate 100 having a multiple layer scheme 199 formed thereon. Cross-section A-A illustrated in FIG. 2A is in a plane perpendicular to the top view, and corresponds to a cross sectional view of the multiple layer scheme 199 disposed on the substrate 100 shown in FIG. 2B. The following figures ending with an "A" designation illustrate respective top views during the example process. The following figures ending with a "B" designation illustrate respective cross-sectional views corresponding to the cross-section A-A. In some figures, some reference numbers of components or features illustrated therein may be omitted to avoid obscuring other components or features; this is for ease of depicting the figures.

The patterning process 10 starts at operation 12 by providing the multiple layer scheme 199 having a multi-layer structure, such as a first tri-layer structure 120, disposed on a film stack 198. A pattern defining layer 112 is disposed between the film stack 198 and the first tri-layer structure 120. As shown in FIGS. 2A and 2B, the structure includes a substrate 100, which is part of a device die, in accordance with some embodiments. The substrate 100 can be or include a bulk semiconductor substrate, a semiconductor-on-insulator (SOI) substrate, or another substrate.

The semiconductor material of the substrate 100 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the substrate 100, the substrate 100 may include semiconductor material disposed on an insulator layer, which may be a buried insulator disposed in a semiconductor substrate, or which may be a glass or sapphire substrate. In certain embodiments, the substrate 100 is a silicon wafer. For example, the substrate 100 may be a round substrate having a 200 mm diameter, a 300 mm diameter, a 450 mm diameter, or other diameters. In other embodiments, the substrate 100 may be any particular size, shape, or materials. For example, the substrate 100 may also be any polygonal, square, rectangular, curved, or otherwise non-circular workpiece.

The substrate 100 may include devices, such as transistors, diodes, other active devices, and/or other passive devices. The devices, in whole or part, may be formed over the substrate 100, may extend into the substrate 100, and/or may extend through the substrate 100.

A material layer 101 is formed between the film stack 198 and the substrate 100. In some embodiments, the material layer 101 is a dielectric layer having a low dielectric constant less than 4, such as less than 3.5. Suitable examples of the material layer 101 comprise SiOC containing layers. It is noted that the multiple layer scheme 199 as utilized assists transferring features into the material layer 101 to facilitate forming semiconductor devices on the substrate 100.

The multiple layer scheme 199 having the multi-layer structure, such as the first tri-layer structure 120, is disposed on the film stack 198 having the pattern defining layer 112 disposed therebetween. The film stack 198 includes a hardmask layer 102, a dielectric layer 104, a silicon upper layer 106, a polymer layer 108, and an etch stop layer (ESL) 110. It is noted that one or more additional layers may be included in the film stack 198. Furthermore, in some embodiments, some of the layers may be eliminated in the film stack 198. In some examples, the hardmask layer 102 may be deposited by plasma enhanced chemical vapor deposition (PECVD) or other suitable deposition processes and may be fabricated from a material selected from a group consisting of TiN, SiON, SiN, SiOC, SiC, and the like. The dielectric layer 104 is a silicon oxide layer. The silicon upper layer 106 is an amorphous silicon layer. The etch stop layer (ESL) 110 can provide a mechanism to stop an etch process when forming contacts, vias, or other features by having a different etch selectivity from adjacent layers or components. The ESL 110 may comprise or be aluminum nitride, silicon oxide, silicon nitride, silicon carbon nitride, silicon carbon oxide, carbon nitride, the like, or a combination thereof. In one example, the ESL 110 is a silicon oxide layer formed by a PECVD process, a high density plasma CVD (HDP-CVD) process, an atomic layer deposition (ALD) process, or other suitable deposition processes.

In some examples, the pattern defining layer 112 described herein is a carbon containing layer and/or a $SiC_xH_yO_z$ material. Suitable examples of the carbon containing layer include amorphous carbon, silicon carbide, or other suitable materials. Suitable deposition processes utilized to form the pattern defining layer 112 include a spin-on coating process, a chemical vapor deposition process, or an atomic layer deposition process. In some examples, the pattern defining layer 112 is a $SiC_xH_yO_z$ material or an amorphous carbon layer formed by a chemical vapor deposition process, or an atomic layer deposition process.

The tri-layer structure 120 disposed above the pattern defining layer 112 includes a top layer 118, a middle layer 116, and a bottom layer 114. In some embodiments, the bottom layer 114 comprises a $C_xH_yO_z$ material, silicon oxide ($SiO_x$), silicon oxycarbide ($SiO_xC_y$), a polymer material, or other suitable materials. The bottom layer 114 may be deposited by a CVD process, an evaporation process, a spin-on process, other suitable deposition processes, or a combination thereof. In certain embodiments, the middle layer 116 comprises a $SiC_xH_yO_z$ material. The middle layer 116 is deposited by a CVD process, an evaporation process, a spin-on process, other suitable deposition processes, or a combination thereof. The top layer 118 comprises a $C_xH_yO_z$ material and a photo-sensitive element, such as a photo-acid generator (PAG) or a photo-base generator (PBG). Examples of PAGs include, but are not limited to, halogenated triazines, onium salts, diazonium salts, aromatic diazonium salts, and combinations thereof. The top layer 118 is deposited by a spin coating process or any suitable deposition technology. It is noted that the bottom layer 114 is fabricated from similar or the same material from the polymer layer 108 in some examples.

Figure 3B:
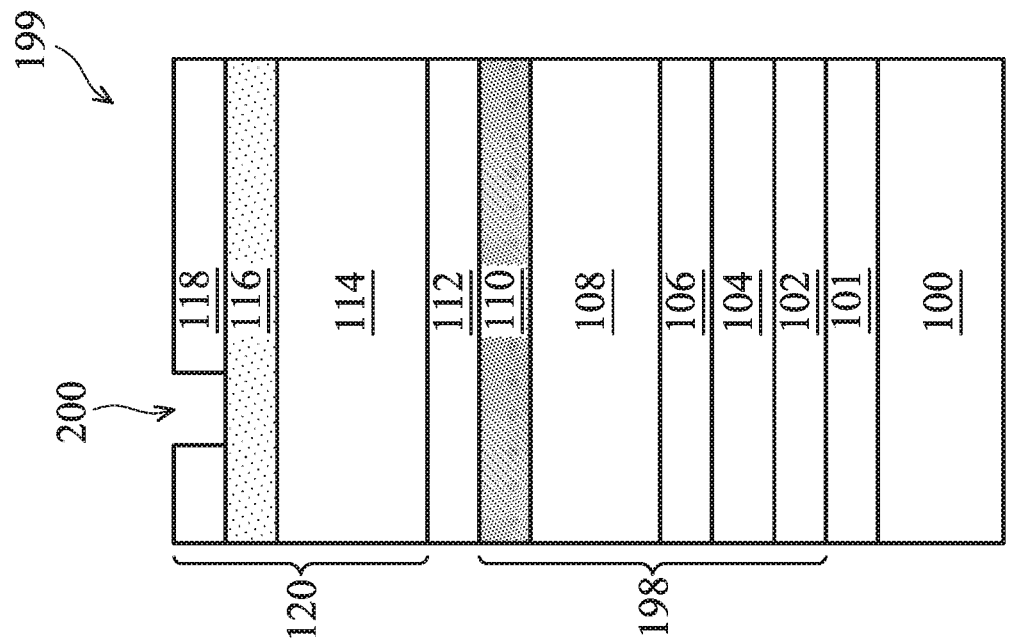
Figure 3A:
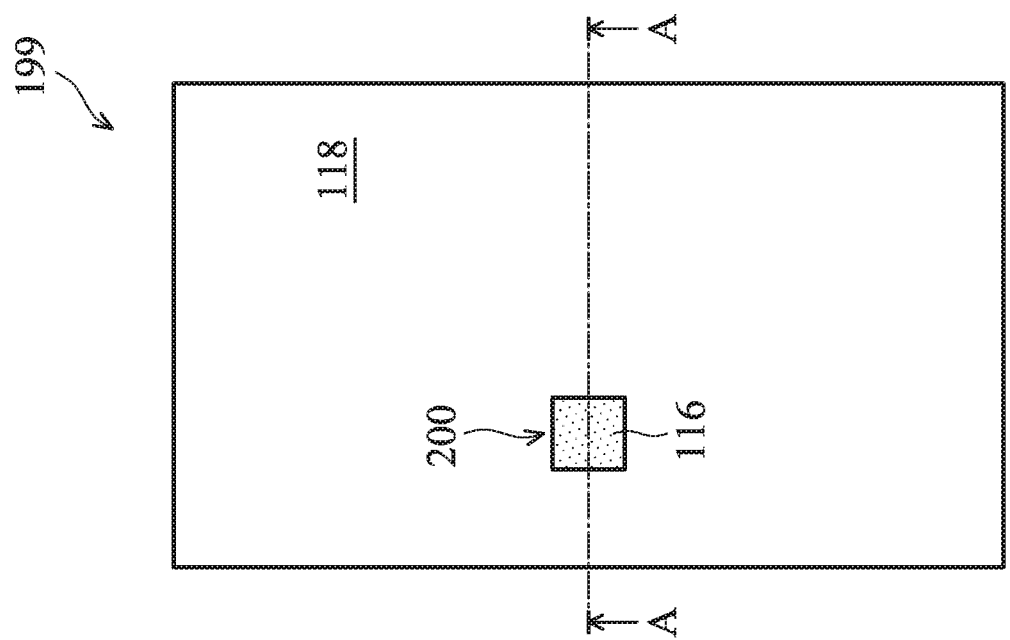

At operation 14, a patterning process (i.e., exposure and development) is performed to form a plurality of apertures 200 in the top layer 118 of the first tri-layer structure 120, as shown in FIGS. 3A and 3B. A photolithography process is performed to pattern the top layer 118, forming the apertures 200 with the desired profile and dimensions. The top layer 118 may be patterned using any suitable photolithography technique. For example, a photomask (not shown) may be disposed over the top layer 118, which may then be exposed to a radiation beam including an ultraviolet (UV) or an excimer laser such as a 248 nm beam from a Krypton Fluoride (KrF) excimer laser, or a 193 nm beam from an Argon Fluoride (ArF) excimer laser. In another example, a reflective EUV mask may be used to reflect a pattern from an EUV light source directed through optics to the EUV mask and then to the substrate to expose a pattern onto the top layer 118. The top layer 118 may undergo a baking process, such as a soft pre-exposure bake to remove solvent used during deposition and/or a post exposure bake to promote adhesion and/or cross-linking induced by an exposure.

Figure 4B:
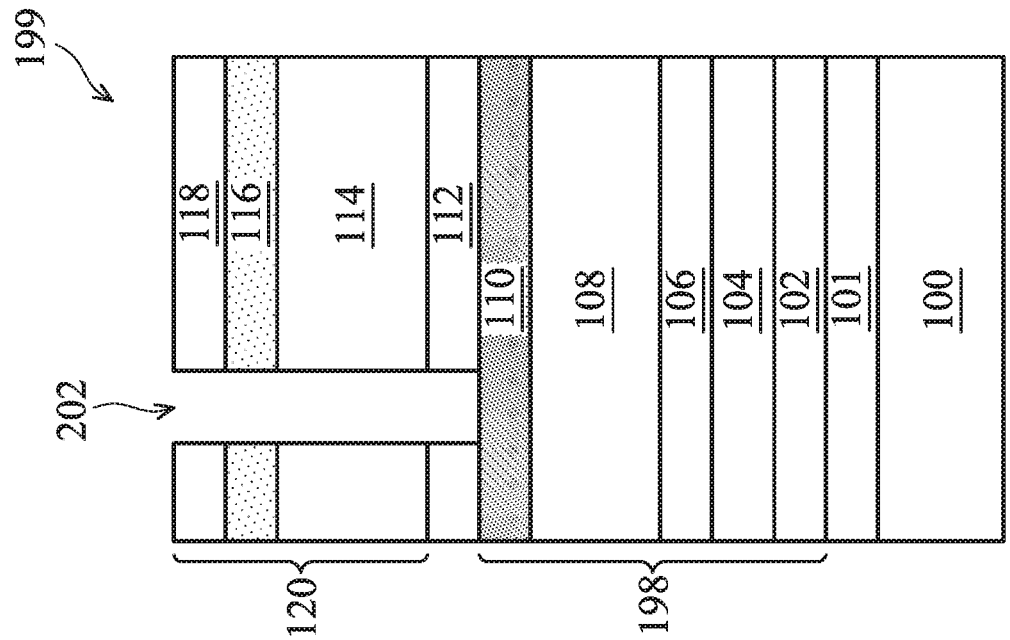
Figure 4A:
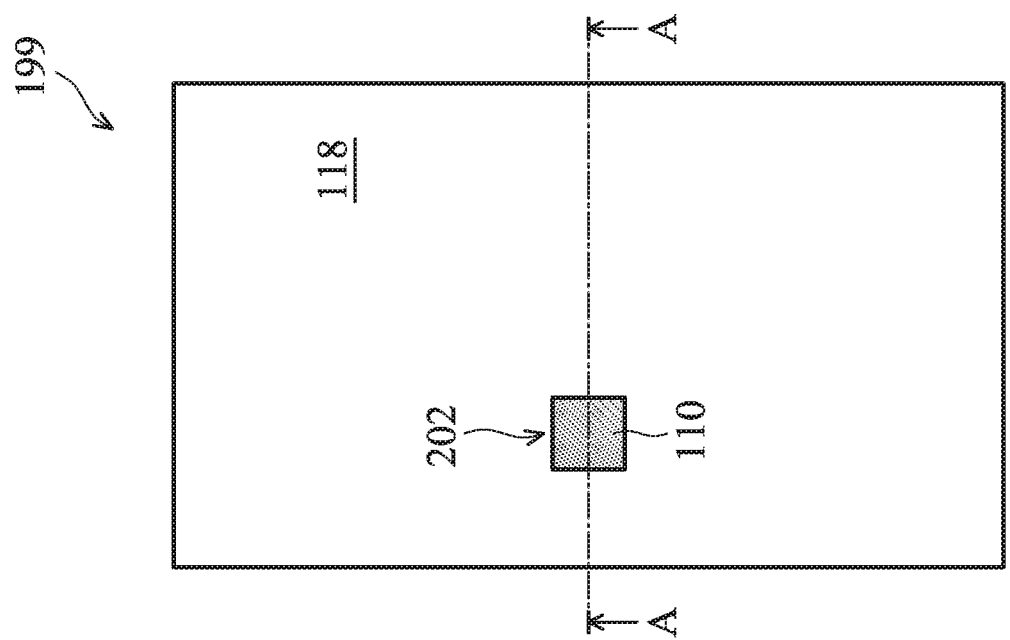

At operation 16, another patterning or etching process is performed to continue patterning the first tri-layer structure 120 through the apertures 200 defined in the top layer 118, forming a first cut opening 202 in the first tri-layer structure 120 and further down through the pattern defining layer 112, as shown in FIGS. 4A and 4B. The first cut opening 202 is formed through the first tri-layer structure 120 to the underlying pattern defining layer 112.

The patterning or etching process may involve a plasma process, such as an inductively coupled plasma (ICP), parallel plate plasma, ion beam etching (IBE), or reactive ion beam etching (RIBE) plasma process. The patterning or etching process includes an etching gas, such as oxygen ($O_2$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), sulfur hexafluoride ($SF_6$), nitrogen trifluoride ($NF_3$), chlorine ($Cl_2$), HCl (hydrogen chloride), $BCl_3$ (boron trichloride), other suitable reactive gases, and combinations thereof. The patterning or etching process may be an anisotropic etch forming substantially vertical sidewalls to the apertures 200 in the first tri-layer structure 120. For example, an anisotropic etch may be achieved by applying a bias to the substrate during etching and/or by directing etch ions in an IBE or RIBE etch vertically towards the substrate. Other patterning or etching process parameters include plasma source power, etch chamber pressure, flow rate of etchant gases, substrate temperature, and other process parameters.

Figure 5B:
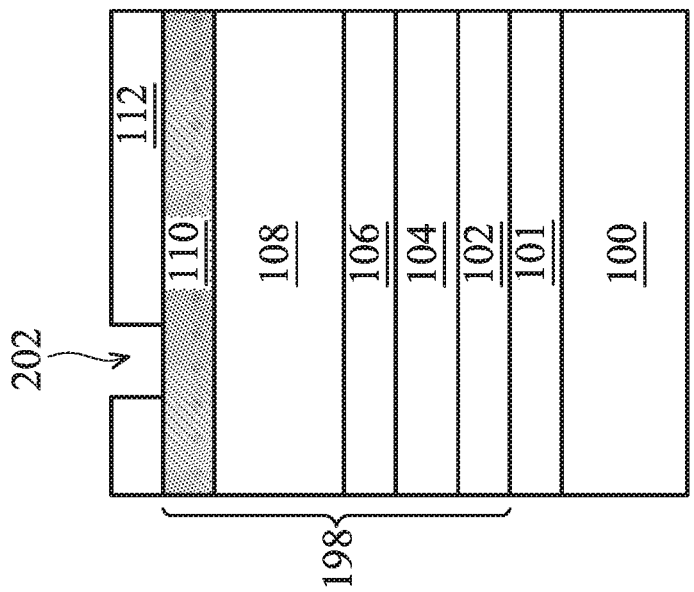
Figure 5A:
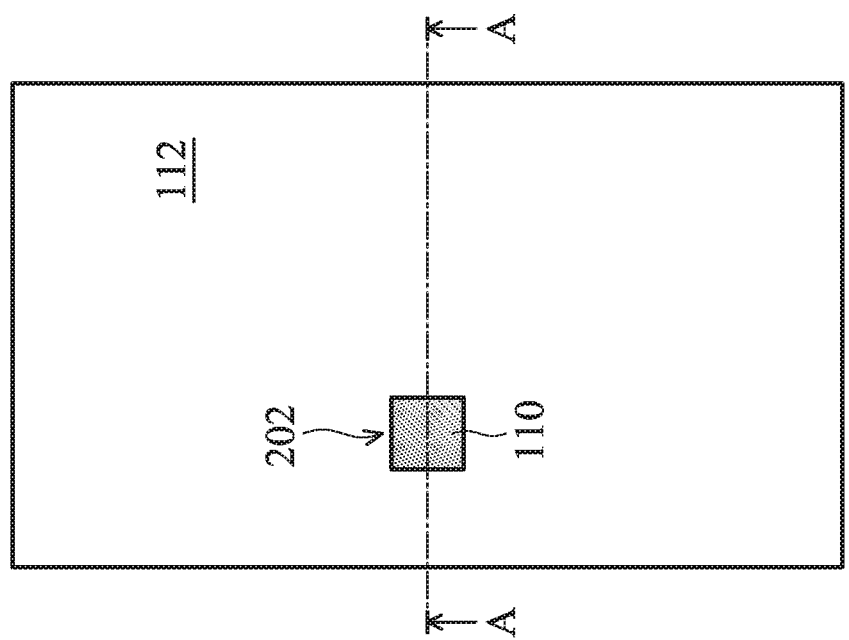

At operation 18, an ash, descum, or a first tri-layer structure removal process is performed to remove the first tri-layer structure 120 from the substrate 100, as shown in FIGS. 5A and 5B, exposing the first cut opening 202 (e.g., an aperture, a gap, or a break) formed in the pattern defining layer 112. The first cut opening 202 is formed in the pattern defining layer 112 with the desired dimension and profile. Thus, the first cut opening 202 in the pattern defining layer 112 can later serve as an etch mask to transfer the first cut opening 202 to the underlying film stack 198.

At operation 20, after the first cut opening 202 is formed, a second multi-layer structure, such as a second tri-layer structure 130, is formed on the pattern defining layer 112, as shown in FIGS. 6A and 6B. The second tri-layer structure 130 is similar to or the same as the first tri-layer structure 120. Similarly, the second tri-layer structure 130 includes a top layer 136, a middle layer 134, and a bottom layer 132. The materials of the top layer 136, the middle layer 134, and the bottom layer 132 are similar to or the same as the top layer 118, the middle layer 116, and the bottom layer 114 in the first tri-layer structure 120.

Figure 7B:
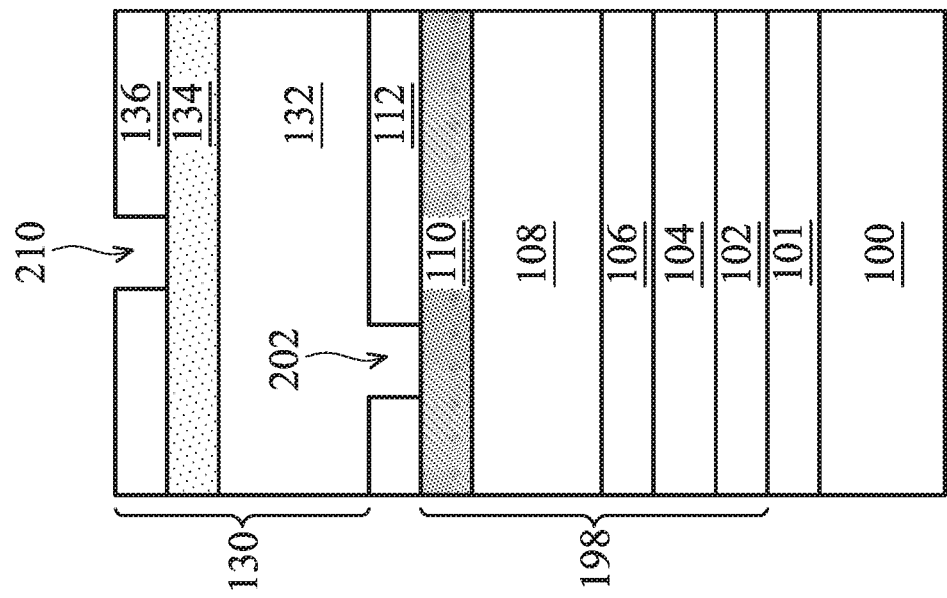
Figure 7A:
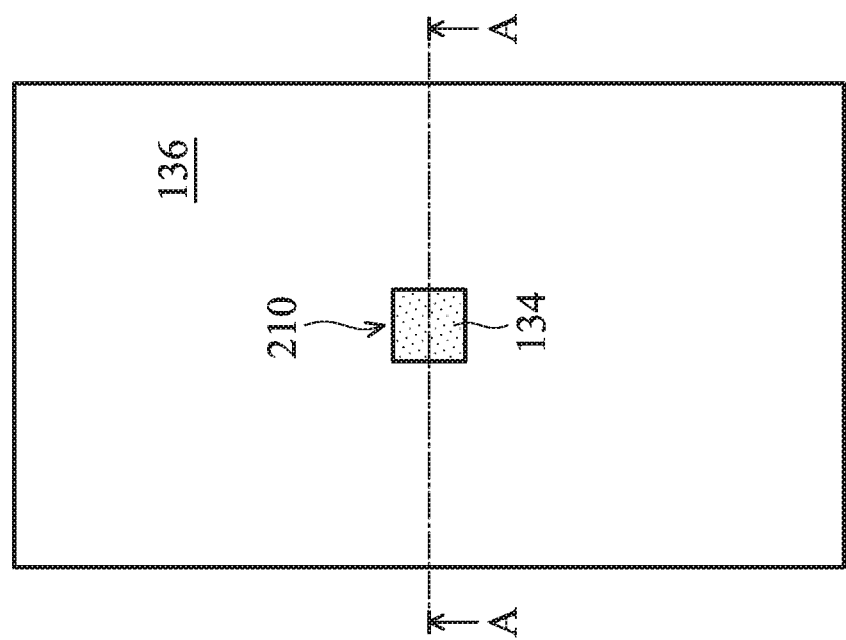

At operation 22, similar to the operation 14, a patterning process is performed to form a plurality of apertures 210 in the top layer 136 of the second tri-layer structure 130, as shown in FIGS. 7A and 7B. A photolithography process is performed to pattern the second top layer 136, forming the apertures 210 with the desired profile and dimensions.

Figure 8B:
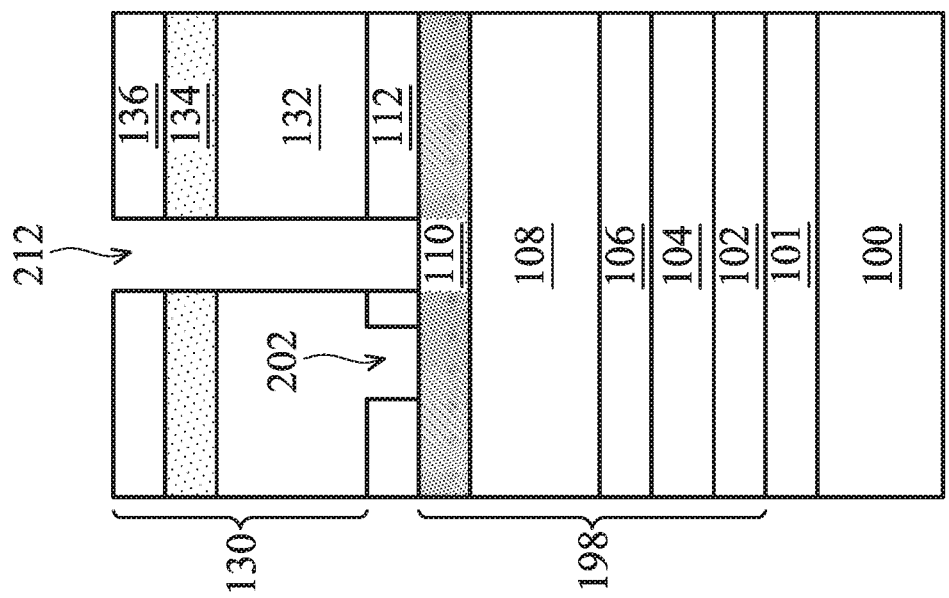
Figure 8A:
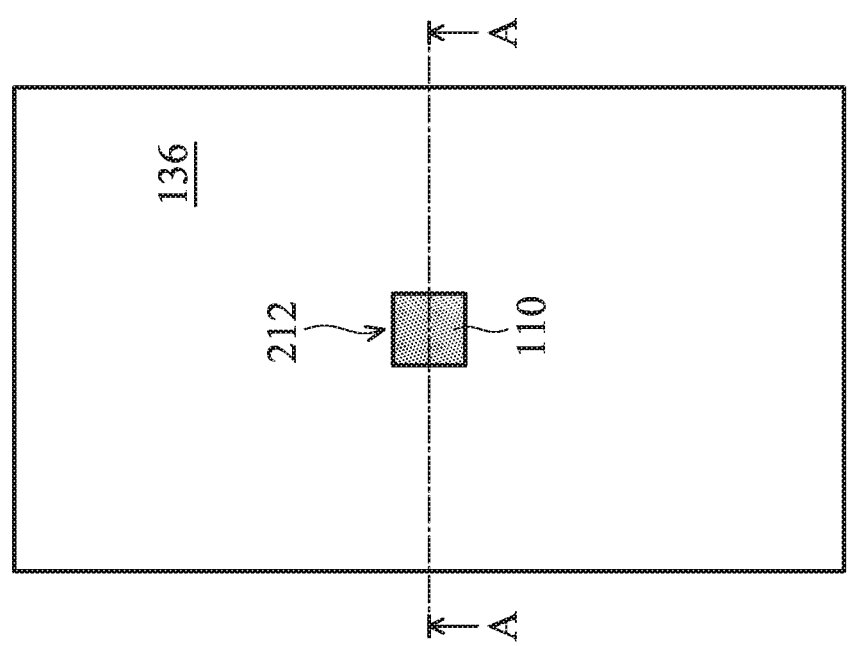

At operation 24, similar to the operation 16, another patterning process is performed to continue patterning the second tri-layer structure 130 through the apertures 210 defined in the top layer 136, forming a second cut opening 212 in the second tri-layer structure 130 and further down through the pattern defining layer 112, as shown in FIGS. 8A and 8B. The second cut opening 212 is formed through second tri-layer structure 130 to the underlying pattern defining layer 112.

Figure 9B:
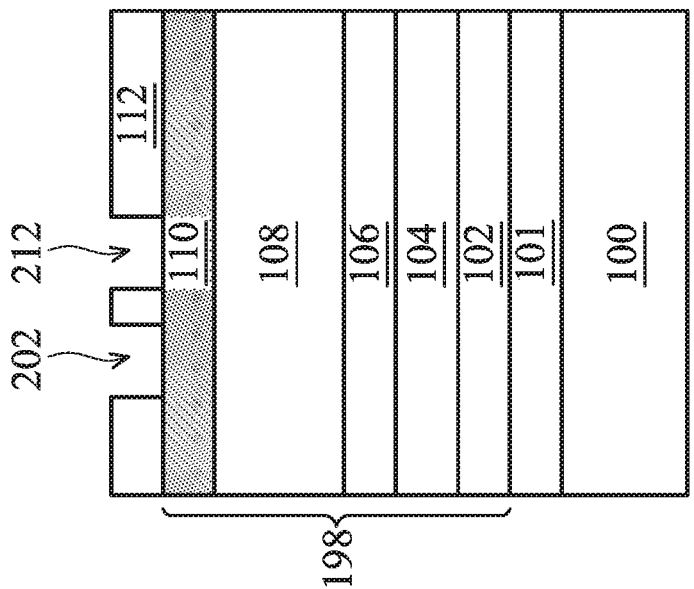
Figure 9A:
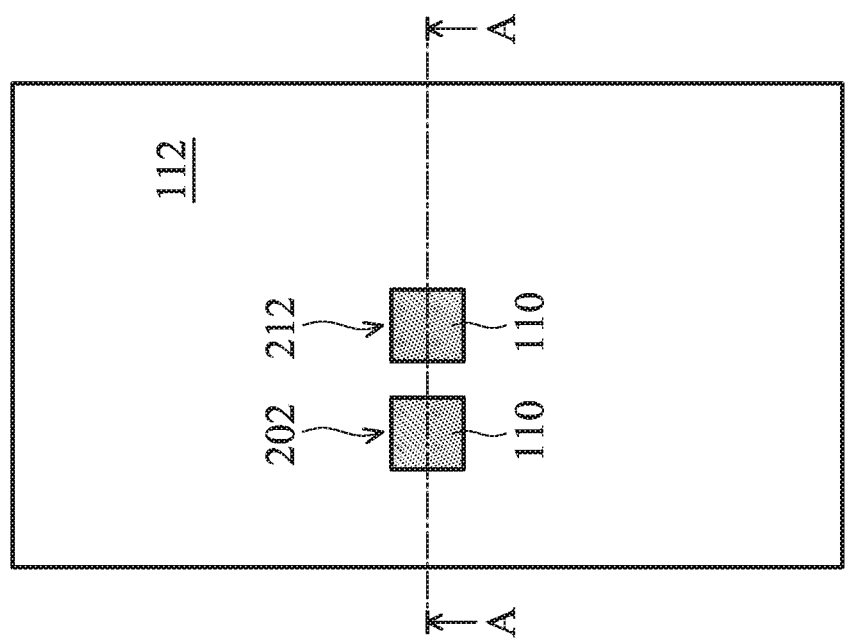

At operation 26, similar to the operation 18, an ash, descum, or a second tri-layer structure removal process is performed to remove the second tri-layer structure 130 from the substrate 100, as shown in FIGS. 9A and 9B, exposing the second cut opening 212 (e.g., an aperture, a trench, or a hole) formed in the pattern defining layer 112. The second cut opening 212 is formed in the pattern defining layer 112 with the desired dimension and profile. Thus, the second cut opening 212 in the pattern defining layer 112 can later serve as an etch mask to transfer the second cut opening 212 to the underlying film stack 198. In some examples, the second cut opening 212 may be formed in an area parallel to and/or some distance away from the first cut opening 202 in the pattern defining layer 112. In other examples, the second cut opening 212 may be formed in an area intersected by and/or perpendicular to the first cut opening 202. The second cut opening 212 may be formed in any suitable relationship to the first cut opening 202.

It is noted that the operation 20 to operation 26 may be repeatedly performed, as indicated by the loop 43, to form as many cut openings in the pattern defining layer 112. Although the example depicted in the process 10 of FIG. 1 FIGS. 1A-1B only depicts forming the first and the second tri-layer structures 120, 130 (e.g., two times using a multi-layer structure to assist transferring cut openings to the pattern defining layer 112), it is noted that a number of tri-layer structures, each comprising a top layer, a middle layer, and a bottom layer, may be implemented. In some examples, at least three cut openings are formed in the pattern defining layer 112 prior to forming line structures therein, which will be described further below.

Figure 10B:
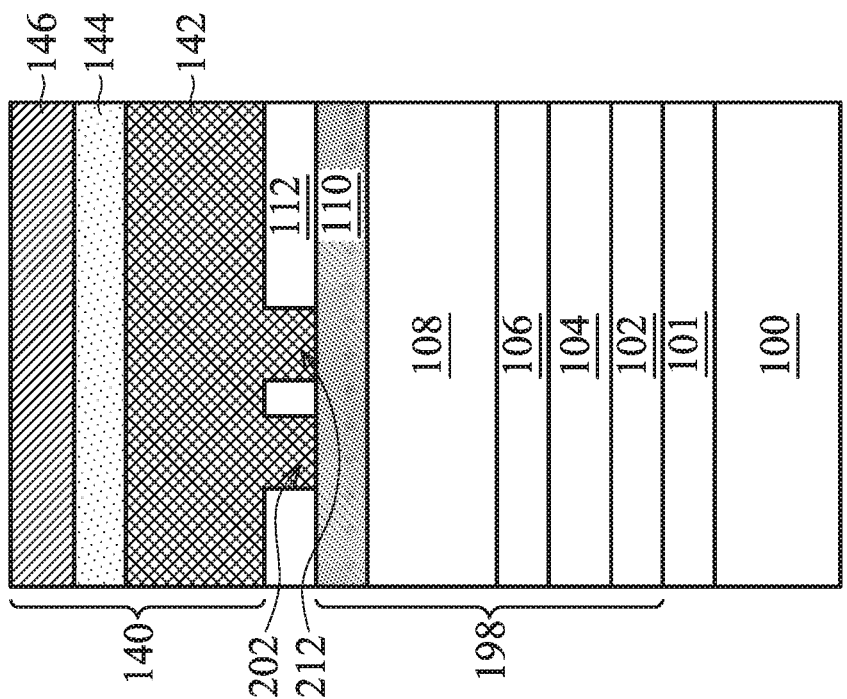
Figure 10A:
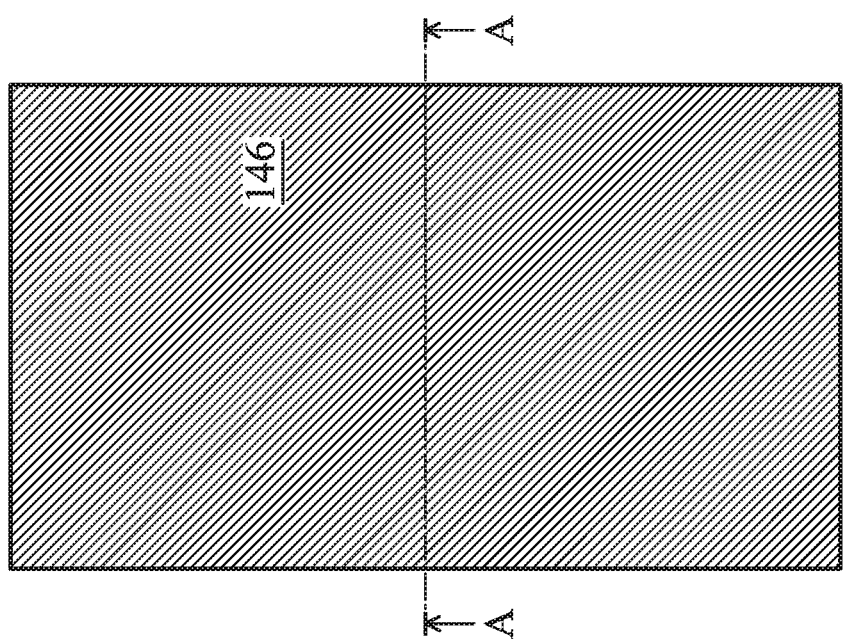

At operation 28, similar to the operation 12 and 20, a multi-layer structure, such as a third tri-layer structure 140, is formed on the patterning defining layer 112, filling the first and the second cut openings 202, 212, as shown in FIGS. 10A and 10B. Unlike the first and the second tri-layer structures 120, 130 described above, the third tri-layer structure 140 as formed here is utilized to transfer line structures, rather than cut openings, to the pattern defining layer 112. The numbers and the configurations of the line structures and cut openings formed in the pattern defining layer 112 may be varied based on different design considerations for different device performance requirements.

Similarly, the third tri-layer structure 140 includes a top layer 146, a middle layer 144, and a bottom layer 142. The materials of the top layer 146, middle layer 144, and the bottom layer 142 are similar to or the same as the top layers 118, 136, the middle layers 116, 134, and the bottom layers 114, 132 in the previous tri-layer structures 120, 130. The bottom layer 142 fills in the cut openings 202, 212 formed in the pattern defining layer 112, as shown in FIG. 10B. The middle layer 144 and the top layer 146 is then formed on the bottom layer 142 to provide a planarization surface for a lithography patterning process.

Figure 11B:
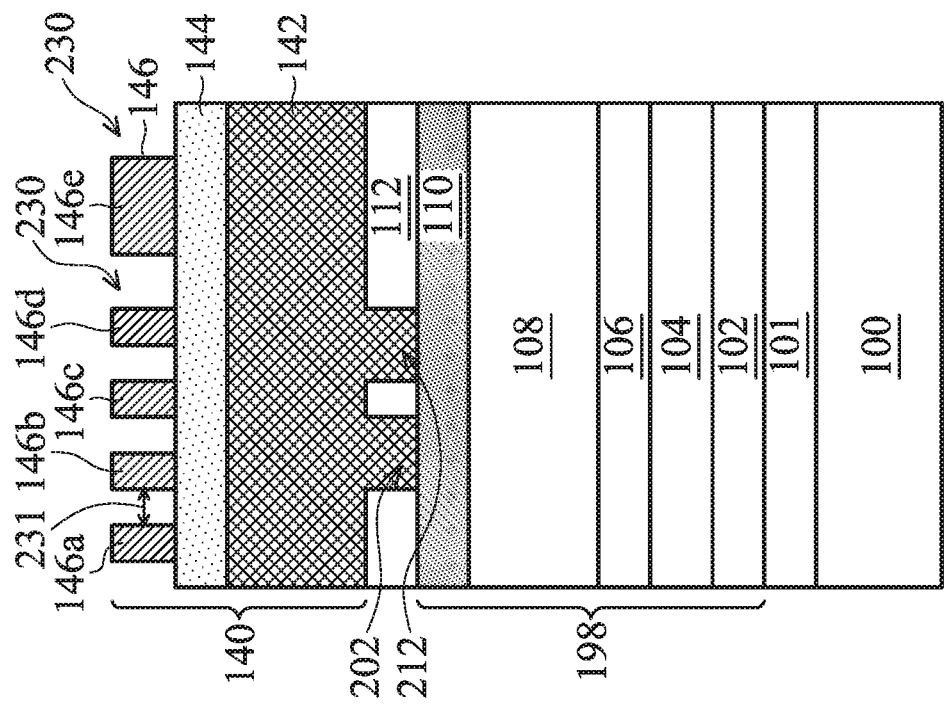
Figure 11A:
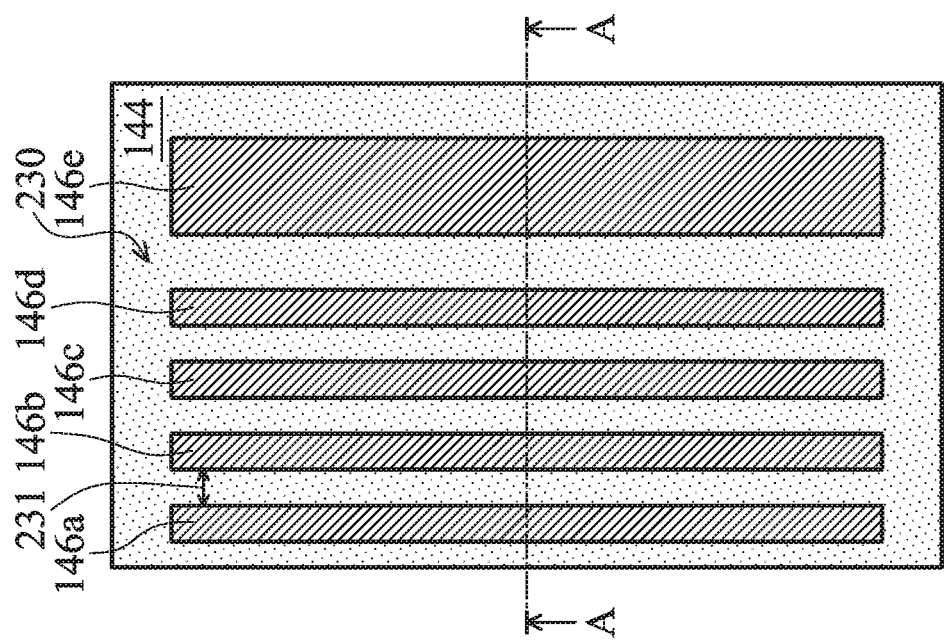

At operation 30, similar to the operations 14 and 22, a patterning process is performed to form a plurality of apertures 230 in the top layer 146 of the third tri-layer structure 140, as shown in FIGS. 11A and 11B. A photolithography process is performed to pattern the top layer 146, forming the apertures 230 with the desired profile and dimensions.

In some examples, the top layer 146 is patterned to form multiple patterned structures (shown as 146a, 146b, 146c, 146d and 146e) above the middle layer 144. The patterned structures 146a, 146b, 146c, 146d, 146e in the top layer 146 may include different dimensions at different locations of the third top layer 146 so as to facilitate forming line structures with different dimensions, shapes and line pitches, when transferring to the pattern defining layer 112 and ultimately to the material layer 101. The pattern structures 146a, 146b, 146c, 146d, 146e are formed at predetermined locations in the top layer 146 so as to facilitate transferring the structures to the desired locations of the underlying layers. In some examples, some of the patterned structures, such as the patterned structures 146b and 146d, are formed above the locations where the first and the second cut openings 202, 212 are formed. For example, the patterned structures 146b and 146d are formed in a location at least partially and vertically aligned or overlapped with the first and the second cut openings 202, 212. By doing so, some of the line structures, while transferring to the patterned defining layer 112, may have a break (e.g., a discontinuity or interruption) in the line pattern in the pattern defining layer 112 due to the first and the second cut openings 202, 212. In contrast, some of the patterned structures, such as the patterned structures 146a, 146c, and 146e, may be formed in locations without the first and the second cut openings 202, 212 aligned or overlapped thereunder. Thus, after the line structures transferred to the patterned defining layer 112, the profile, dimension, and shape defined from the patterned structures 146a, 146c, and 146e may transfer and stay intact in the pattern defining layer 112 without alteration or interruption.

The line structure as referred here, upon completion of the structures transferred to the underlying material layer 101, often describes the structures with a longitudinal length. Various line structures may be formed in certain directions parallel to each other. In some embodiments, various line structures may be formed perpendicular to or intersected with each other.

The cut openings as referred here, upon completion of the structures transferred to the underlying material layer 101, correspond to the breaks, trenches, or interruptions between line structures, forming an end to end space between, e.g., longitudinally aligned line structures. Details regarding the end to end space, the cut openings, and the line structures will be further described below with referenced to FIGS. 13A and 13B.

Figure 12B:
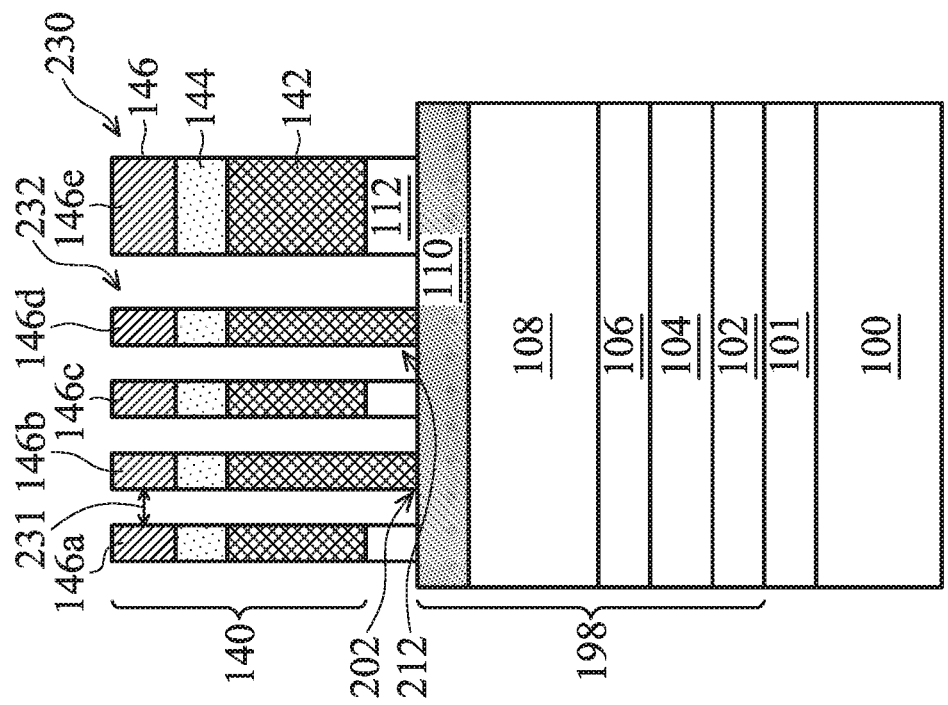
Figure 12A:
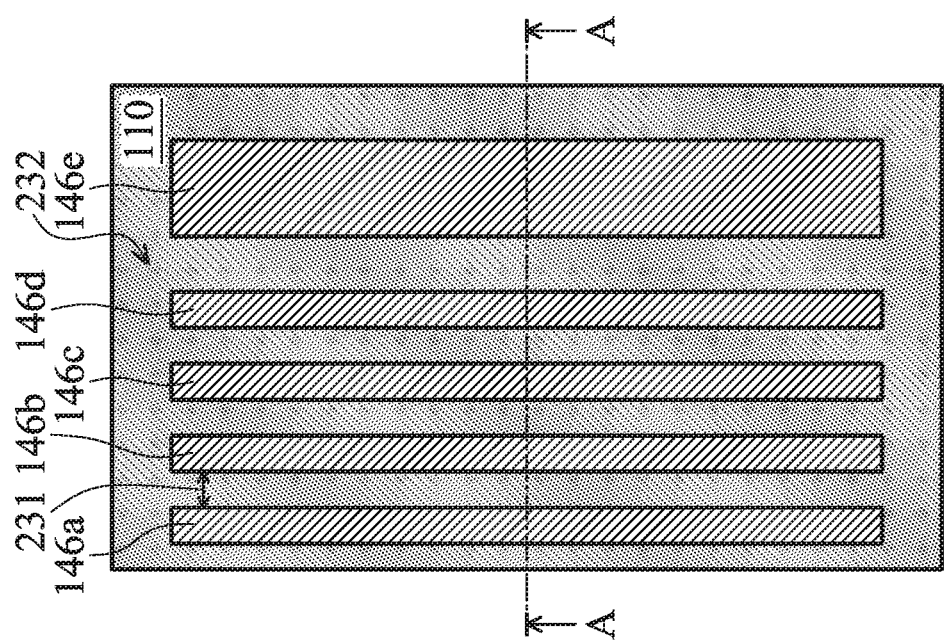

At operation 32, similar to the operations 16 and 24, another patterning process is performed to continue patterning the third tri-layer structure 140 through the apertures 230 defined in the top layer 146, forming apertures 232 in the third tri-layer structure 140 and further transferring structures down to the pattern defining layer 112 by the patterning process or additional processes, as shown in FIGS. 12A and 12B. The apertures 232 in the third tri-layer structure 140 assist transferring structures into the underlying pattern defining layer 112.

At operation 34, similar to the operation 18 and 26, an ash, descum, or a third tri-layer structure removal process is performed to remove the third tri-layer structure 140 from the substrate 100, as shown in FIGS. 13A and 13B. As the first and the second cut openings 202, 212 (e.g., gaps or interruptions) were previously patterned into the pattern defining layer 112, some line structures intersect with the first and the second cut openings 202, 212 (e.g., gaps, breaks or interruptions). For example, the line structures 112b, 112d (shown in dotted lines) are missing and interrupted in the locations where the first and the second cut openings 202, 212 (e.g., gaps, breaks or interruptions) are formed, as shown in the cross sectional view in FIG. 13B. In contrast, the line structures 112a, 112c, 112e are formed in the pattern defining layer 112 in the designated locations defined between the apertures 230 from the third tri-layer structure 140. As a result, the line structures 112b, 112d remain intact in the pattern defining layer 112 in the locations different from the locations where the first and the second cut openings 202, 212 are formed, as shown in the top view of FIG. 13A. The first and the second cut openings 202, 212 define end-to-end open spaces S1, S2 (e.g., a break, an interruption, or a discontinuity) in the line structures 112b, 112d respectively in the pattern defining layer 112. In some examples, the dimensions 310, 320 of the end-to-end open spaces S1, S2 are between about 5 nm and about 30 nm. In some examples, the end-to-end open spaces S1, S2 may be aligned in a Y direction. In some examples, the end-to-end open spaces S1, S2 may have center points offset from each other in X or Y directions. The end-to-end open spaces S1, S2 may have any suitable physical relationship or coordination to each other. Although the example depicted in FIGS. 13A and 13B have two cut openings 202, 212 with two end-to-end open spaces S1, S2, it is noted that more than two cut openings may be formed between any of the line structures 112a-112e for different device performance requirements.

Similarly, the operation 28 to operation 34 may be repeatedly performed, as indicated by the loop 45, to form as many line structures in the pattern defining layer 112. Although the example depicted in the process 10 of FIGS. 1A-1B only depicts forming the third tri-layer structures 140 (e.g., one use of the tri-layer structure to assist transferring line structures to the pattern defining layer 112), it is noted that any number of tri-layer structures, each comprising a top layer, a middle layer, and a bottom layer, may be implemented to form as many line structures with the same or different profiles, dimensions, orientations, and directionalities. Although the example depicts that the third tri-layer structures 140 produces five line structures 112a, 112b, 112c, 112d, 112e with cut openings 202, 212 formed between line structures 112b, 112d, it is noted that any number of line structures may be formed.

Figure 14B:
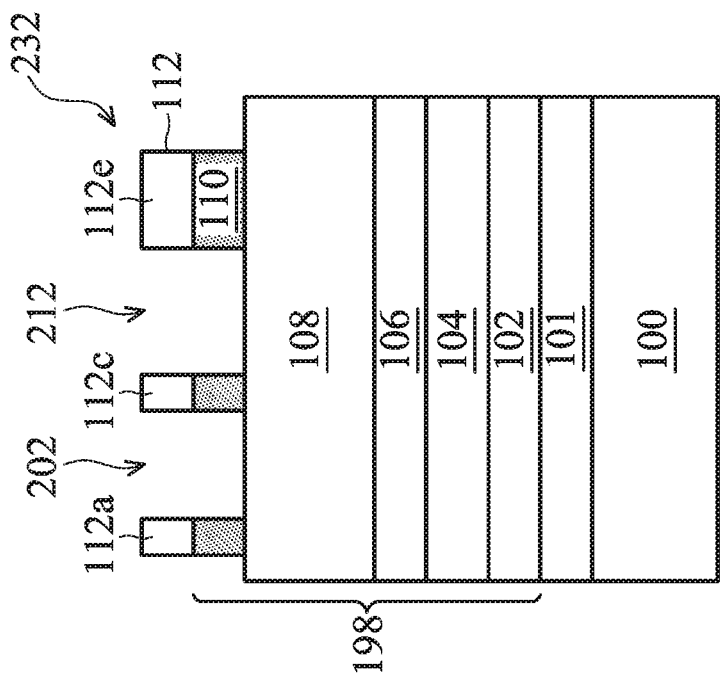
Figure 14A:
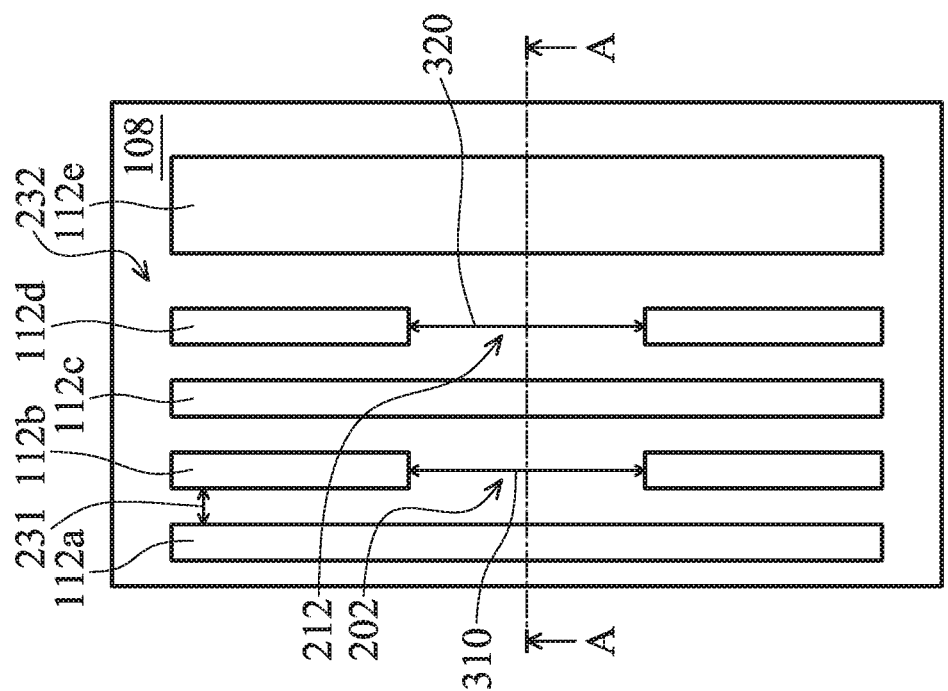

At operation 36, after the desired structures are formed and patterned in the pattern defining layer 112, an etching process is performed to pattern the etch stop layer 110, as shown in FIGS. 14A and 14B. The pattern defining layer 112 servers as an etching mask to transfer the structures formed in the pattern defining layer 112 into the underlying etch stop layer 110.

Figure 16B:
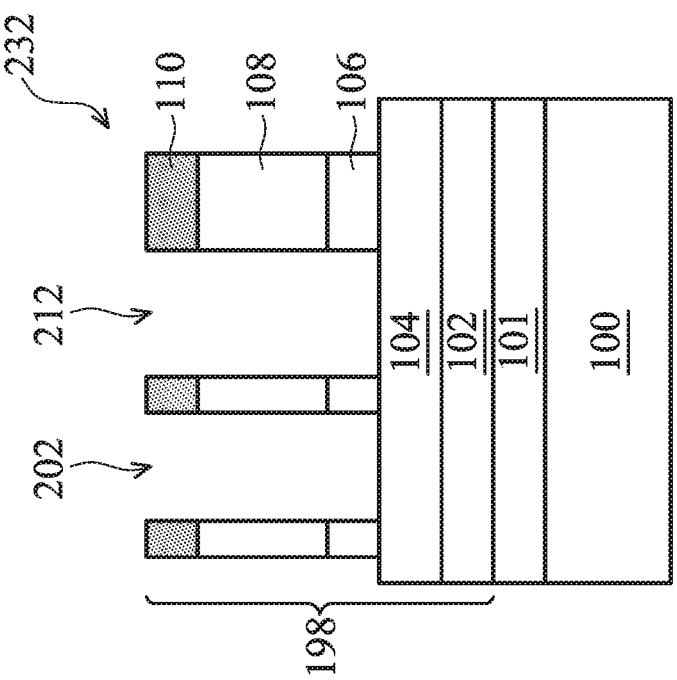
Figure 16A:
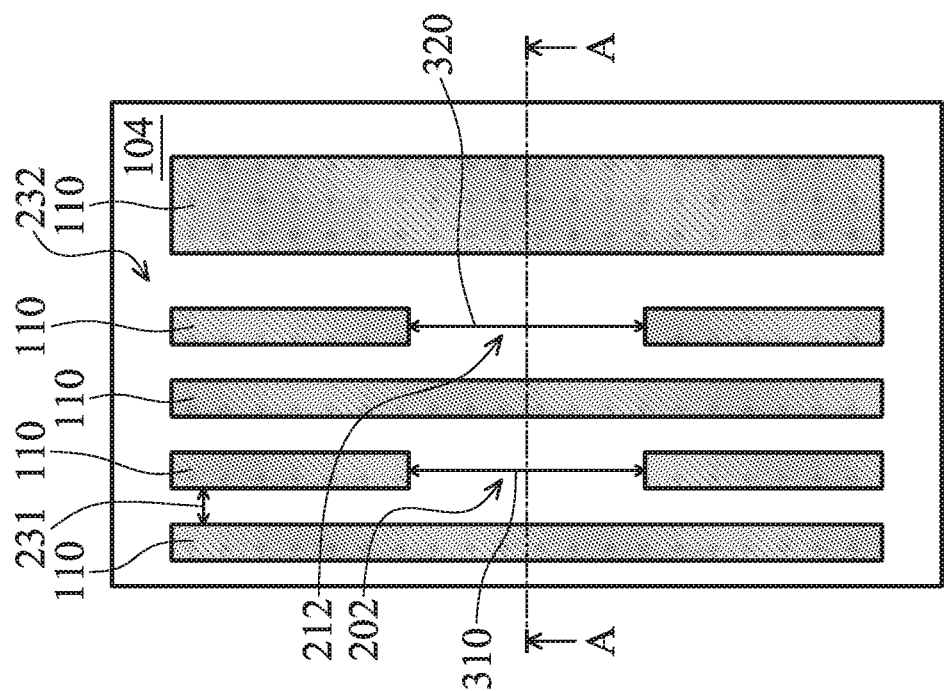

At operation 38, after the structures are transferred into the etch stop layer 110, an additional patterning process is performed to pattern the remaining layers (including the polymer layer 108, the silicon upper layer 106, the dielectric layer 104 and the hardmask layer 102) in the film stack 198 until the substrate 100 is exposed. In some examples, the pattern defining layer 112 may be removed or consumed while pattering and transferring the structures to the etch stop layer 110, as shown in FIGS. 15A and 15B. Subsequently, the patterning process and/or the etching process may be continuously performed to etch the polymer layer 108 and the silicon upper layer 106 in the film stack 198, using the etch stop layer 110 as an etching mask, as shown in FIGS. 16A and 16B. The remaining layers (e.g., the dielectric layer 104 and the hardmask layer 102) may then be patterned with the assistance of the silicon upper layer 106 (or other remaining layers) on the film stack as the etching mask, as shown in FIGS. 17A and 17B. Additional patterning process and etching processes may be selected and performed to etch the remaining layer in the film stack until the desired features and structures are formed in the material layer 101 and the substrate 100 is exposed.

It is noted that while patterning the film stack 198, no additional multi-layer structures are used to further pattern the film stack 198. Features or structures to be transferred to the material layer 101 have been previously defined and patterned in the pattern defining layer 112. Multiple uses of the multi-layer structure, such as tri-layer structures, are often utilized in patterning and defining the pattern defining layer 112, but not in the underlying film stack 198.

The pattern defining layer 112 allows the desired features, profiles, configurations and dimensions of the structure to be formed in the pattern defining layer 112 prior to etching to the target underlying material layer 101. The pattern defining layer 112 can assist defining the desired features and structures in the pattern defining layer 112 by multiple uses of the tri-layer structures. By doing so, the structures and features may be repeatedly modified and trimmed to the desired dimensions and profiles prior to etching and patterning the target material layer 101 disposed underneath. Repetitive use of the tri-layer structures formed above the pattern defining layer 112 may serve as a first buffer structure to slowly, gradually and mildly pattern the structures and features into the pattern defining layer 112 without early patterning the target material layer 101. Furthermore, with the assistance of the film stack 198, e.g., a second buffer structure, disposed between the pattern defining layer 112 and the target material layer 101, the structures and features defined in the pattern defining layer 112 can also be slowly, gradually and mildly transferred to the target material layer 101 with the desired profiles and dimensions. In some embodiments when the silicon upper layer 106 is overly early etched to serve as a silicon mandrel, undesired defects, such as striations or stitches are often undesirably observed. Thus, by utilizing the multiple uses of the multi-layer structure, such as the tri-layer structures, above the pattern defining layer 112, the desired features and structures may be formed in and above the pattern defining layer 112. The etch stop layer 110 disposed below the pattern defining layer 112 also assists preventing the features and structures from early over-etching down to the silicon upper layer 106, thus efficiently eliminating undesired generation of the defects.

Embodiments of the present disclosure provide methods of fabricating a semiconductor structure. The method utilizes a pattern defining layer and multiple uses of a multiple layer structure, such as a tri-layer structure, on the pattern defining layer to form features and structures in a material layer. The multi-layer structure includes a bottom layer, a middle layer, and a top layer over the middle layer. The pattern defining layer comprises a SiCxHyOz material or amorphous carbon layer that facilitates the features and structures to be defined therein without early deformation or collapse of the features and structures. An etch stop layer disposed under the pattern defining layer also assists sustaining the features and structures transferring to the pattern defining layer without damaging nearly layers and structures.

In an embodiment, a method of fabricating a semiconductor structure includes forming a first multi-layer structure on a pattern defining layer disposed on a film stack on a substrate, patterning the first multi-layer structure to form an aperture in the first multi-layer structure, forming a first cut opening in the pattern defining layer through the aperture defined by the first multi-layer structure, and forming a second multi-layer structure on the pattern defining layer, a portion of the second multi-layer structure being disposed in the first cut opening.

In another embodiment, a method of fabricating a semiconductor structure includes (a) forming a multi-layer structure on a pattern defining layer disposed on a film stack, (b) patterning the multi-layer structure to form an aperture in the multi-layer structure, (c) forming a cut opening in the pattern defining layer through the aperture defined in the multi-layer structure, and (d) repeating the operations (a) to (c) until at least two cut openings are formed in line structures in the pattern defining layer.

In yet embodiment, a method of fabricating a semiconductor structure includes forming a first multi-layer structure on a pattern defining layer disposed on a film stack disposed on a substrate, patterning the first multi-layer structure to form a first cut opening in the pattern defining layer, forming a second multi-layer structure on the pattern defining layer, patterning the second multi-layer structure to form a second cut opening in the pattern defining layer, forming a third multi-layer structure on the pattern defining layer, patterning the third multi-layer structure to form a line structure in the pattern defining layer, wherein the line structures intersect with the first and the second cut openings, and using the pattern defining layer as an etching mask layer to pattern the film stack until the substrate is exposed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, the method comprising:
    forming a first multi-layer structure on a pattern defining layer disposed on a film stack on a substrate;
    patterning the first multi-layer structure to form an aperture in the first multi-layer structure;
    forming a first cut opening in the pattern defining layer through the aperture defined by the first multi-layer structure; and
    forming a second multi-layer structure on the pattern defining layer, a portion of the second multi-layer structure being disposed in the first cut opening.

2. The method of claim 1, wherein the first multi-layer structure includes a top layer, a middle layer, and a bottom layer.

3. The method of claim 1, wherein the pattern defining layer is a SiCxHyOz material or an amorphous carbon layer.

4. The method of claim 1, wherein the film stack comprises an etch stop layer disposed under the pattern defining layer.

5. The method of claim 4, wherein the etch stop layer is a silicon oxide layer.

6. The method of claim 1, further comprising:
    patterning the second multi-layer structure to form an aperture in the second multi-layer structure; and
    forming a second cut opening in the pattern defining layer through the aperture defined by the second multi-layer structure.

7. The method of claim 6, further comprising:
    forming a third multi-layer structure on the pattern defining layer;
    patterning the third multi-layer structure to form an aperture in third second multi-layer structure; and
    forming line structures in the pattern defining layer using the aperture defined by the third multi-layer structure, wherein the line structures intersect with the first and the second cut openings.

8. The method of claim 7, wherein the first and the second cut openings each create an end-to-end open space between the line structures in the pattern defining layer.

9. The method of claim 8, wherein the end-to-end open space has a dimension between about 5 nm and about 30 nm.

10. The method of claim 7, further comprising:
    patterning the film stack using the pattern defining layer as an etching mask.

11. The method of claim 10, further comprising:
    continuing patterning the film stack until the substrate is exposed.

12. The method of claim 11, further comprising:
    transferring the first and second cut openings and the line structures into a material layer disposed below the film stack and above the substrate.

13. The method of claim 1, wherein the film stack further comprises a silicon upper layer disposed on a dielectric layer disposed on a hardmask layer.

14. The method of claim 13, wherein the silicon upper layer is an amorphous silicon layer, and the hardmask layer is a TiN layer.

15. The method of claim 1, wherein the second multi-layer structure has the same structure as the first multi-layer structure.

16. A method of fabricating a semiconductor structure, the method comprising:
   (a) forming a multi-layer structure on a pattern defining layer disposed on a film stack;
   (b) patterning the multi-layer structure to form an aperture in the multi-layer structure;
   (c) forming a cut opening in the pattern defining layer through the aperture defined in the multi-layer structure;
   (d) repeating operations (a) through (c) until at least two cut openings are formed in the pattern defining layer; and
   (e) patterning the pattern defining layer with at least two line structures, wherein each of the at least two line structures intersects a corresponding one of the at least two cut openings.

17. The method of claim 16, wherein the film stack comprises an etch stop layer disposed under the pattern defining layer.

18. The method of claim 16, wherein the at least two cut openings each create an end-to-end open space in corresponding ones of the at least two line structures in the pattern defining layer.

19. The method of claim 16, wherein the pattern defining layer is a SiCxHyOz material or an amorphous carbon layer.

20. A method of fabricating a semiconductor structure, the method comprising:
   forming a first multi-layer structure on a pattern defining layer disposed on a film stack disposed on a substrate;
   patterning the first multi-layer structure to form a first cut opening in the pattern defining layer;
   forming a second multi-layer structure on the pattern defining layer;
   patterning the second multi-layer structure to form a second cut opening in the pattern defining layer;
   forming a third multi-layer structure on the pattern defining layer;
   patterning the third multi-layer structure to form a first line structure and a second line structure in the pattern defining layer, wherein the first line structure intersects with the first cut opening and the second line structure intersects with the second cut opening; and
   using the pattern defining layer as an etching mask layer to pattern the film stack until the substrate is exposed.

* * * * *